United States Patent
Hu

(10) Patent No.: US 10,554,168 B2
(45) Date of Patent: Feb. 4, 2020

(54) LIGHT-CONCENTRATING SOLAR SYSTEM

(71) Applicant: BOLYMEDIA HOLDINGS CO. LTD., Santa Clara, CA (US)

(72) Inventor: Xiaoping Hu, Shenzhen (CN)

(73) Assignee: BOLYMEDIA HOLDINGS CO. LTD., Santa Clara, CA (US)

( * ) Notice: Subject to any disclaimer, the term of this patent is extended or adjusted under 35 U.S.C. 154(b) by 0 days.

(21) Appl. No.: 15/779,821

(22) PCT Filed: Dec. 1, 2015

(86) PCT No.: PCT/CN2015/096095
§ 371 (c)(1),
(2) Date: May 29, 2018

(87) PCT Pub. No.: WO2017/091971
PCT Pub. Date: Jun. 8, 2017

(65) Prior Publication Data
US 2018/0375464 A1    Dec. 27, 2018

(51) Int. Cl.
*H02N 6/00* (2006.01)
*H01L 31/042* (2014.01)
(Continued)

(52) U.S. Cl.
CPC .......... *H02S 40/22* (2014.12); *G02B 19/0028* (2013.01); *G02B 19/0042* (2013.01);
(Continued)

(58) Field of Classification Search
CPC .......................... H02S 40/22; H01L 31/0543
(Continued)

(56) References Cited

U.S. PATENT DOCUMENTS

| | | | | |
|---|---|---|---|---|
| 7,081,584 B2* | 7/2006 | Mook | .................. | H01L 31/052 |
| | | | | 126/683 |
| 2003/0075213 A1* | 4/2003 | Chen | ................... | H01L 31/0543 |
| | | | | 136/246 |
| 2006/0266408 A1* | 11/2006 | Horne | .................. | H01L 31/052 |
| | | | | 136/246 |
| 2008/0115823 A1 | 5/2008 | Kinsey | | |
| 2011/0005580 A1* | 1/2011 | Vandermeulen | ........ | H02S 50/00 |
| | | | | 136/251 |

(Continued)

FOREIGN PATENT DOCUMENTS

CN    101640502 A    2/2010
CN    101661966 A    3/2010
(Continued)

OTHER PUBLICATIONS

English machine translation of CN 202134560 U (Year: 2018).*
(Continued)

*Primary Examiner* — Angelo Trivisonno
(74) *Attorney, Agent, or Firm* — Ladas & Parry, LLP

(57) ABSTRACT

A light-concentrating, solar system, comprising: a first Fresnel lens (111) provided with at least one tooth face, wherein each tooth face contains at least one Fresnel unit; two reflective faces (112, 113) arranged to enable incident sunlight to converge via the first Fresnel lens (111), and then to irradiate to a first reflective face (112), and at least part of the incident sunlight to be reflected onto a second reflective face (113) by the first reflective face (112); and a photovoltaic panel (114) arranged to enable at least part of the sunlight reflected by the second reflective face (113) to directly irradiate to or be led to irradiate to the photovoltaic panel (114). Since a twice-reflection structure is adopted, on one hand, the system can provide a higher light-concentration ratio; on the other hand, the height of the system can be reduced; and at the same time, a structural design of the system has better flexibility, so that a peripheral design, such as heat dissipation or heat energy utilization, of a photovoltaic panel can be performed more easily.

8 Claims, 4 Drawing Sheets

(51) Int. Cl.
| | |
|---|---|
| *H02S 40/22* | (2014.01) |
| *H02S 40/12* | (2014.01) |
| *H02S 40/32* | (2014.01) |
| *H02S 40/38* | (2014.01) |
| *H02S 40/44* | (2014.01) |
| *G02B 19/00* | (2006.01) |
| *H02S 20/10* | (2014.01) |
| *H02S 20/23* | (2014.01) |
| *F24S 20/00* | (2018.01) |
| *H02S 50/00* | (2014.01) |

(52) U.S. Cl.
CPC .............. *H02S 40/12* (2014.12); *H02S 40/32* (2014.12); *H02S 40/38* (2014.12); *H02S 40/44* (2014.12); *F24S 2020/17* (2018.05); *H02S 20/10* (2014.12); *H02S 20/23* (2014.12); *H02S 50/00* (2013.01)

(58) Field of Classification Search
USPC ........................................................ 136/259
See application file for complete search history.

(56) References Cited

U.S. PATENT DOCUMENTS

2013/0008487 A1   1/2013   Chia-Chen et al.

FOREIGN PATENT DOCUMENTS

| CN | 102280511 A | 12/2011 |
| CN | 202134560 U * | 2/2012 |
| CN | 202134560 U | 2/2012 |
| CN | 103474497 A | 12/2013 |

OTHER PUBLICATIONS

International Search Report for PCT/CN2015/096095, dated Aug. 29, 2016, and its English translation provided by WIPO.
Written Opinion of the International Search Authority for PCT/CN2015/096095, dated Aug. 29, 2016, and its English translation from Bing.com Microsoft Translator.

* cited by examiner

LIGHT-CONCENTRATING SOLAR SYSTEM

CROSS REFERENCE TO RELATED APPLICATION

The present application is the U.S. national phase of PCT Application PCT/CN2015/096095 filed on Dec. 1, 2015, entitled "LIGHT-CONCENTRATING SOLAR SYSTEM", the disclosure of which is hereby incorporated by reference in its entirety.

TECHNICAL FIELD

The present disclosure relates to clean energy, and in particular, to light-concentrating solar energy systems utilizing solar energy.

PRIOR ART

With increasing emphasis on environmental protection, solar energy systems are growing in popularity. Solar energy systems commonly seen at present are installed on roofs or pavements, such as solar water heating systems that perform photothermal conversion, solar power generation systems that perform photovoltaic conversion, and the like.

Energy conversion devices of these common solar energy systems, such as solar vacuum tube or photovoltaic panel, generally face the sunlight directly. The area of their own working surface is the maximum area which is capable of receiving the sunlight, restricting the collection of solar energy by the traditional solar energy systems. Moreover, the larger the working surface of the photovoltaic panel, the higher the cost. For the sake of simplicity, the "photovoltaic panels" herein represent various possible photovoltaic devices, including but not limited to, polysilicon photovoltaic panels, monocrystalline silicon photovoltaic panels, amorphous silicon photovoltaic panels, III-V semiconductor photovoltaic panels, copper indium gallium selenide (CIGS) photovoltaic panels, perovskite photovoltaic panels, and photovoltaic films, which will not be repeated below.

In order to increase the ability to collect solar energy, a light-concentrating solar energy system has emerged; for example, the one disclosed in Chinese Patent Application No. CN101640502A entitled as "Method for assembling optical collector photoelectrical solar cell array". With the method, the sunlight may be focused on a photovoltaic panel via a lens, so that a photovoltaic panel having a smaller area is able to capture the sunlight concentrated by a lens having a larger area.

However, a conventional condenser lens may focus the sunlight directly to a photovoltaic panel, making the mounting structure thereof subject to many restrictions. In order to make better use of limited space and increase the flexibility of use, more practical solutions may still be hoped to be provided.

SUMMARY OF THE INVENTION

A light-concentrating solar energy system according to the present disclosure may include a first Fresnel lens, a first reflecting surface and a second reflecting surface, and a first photovoltaic panel. The first Fresnel lens is provided with at least one tooth surface, wherein each tooth surface has at least one Fresnel unit. The first reflecting surface and the second reflecting surface are arranged to enable incident sunlight to converge via the first Fresnel lens, and then to irradiate to the first reflecting surface, and at least part of the incident sunlight is reflected onto the second reflecting surface by the first reflecting surface. The first photovoltaic panel is arranged to enable at least part of the sunlight reflected by the second reflecting surface to directly irradiate to or be led to irradiate to the first photovoltaic panel.

According to the light-concentrating solar energy system of the present disclosure, the sunlight may irradiate onto the photovoltaic panel after converged at least once by the Fresnel lens and reflected at least twice. On the one hand, the system can provide a higher light-concentration ratio (i.e. the ratio of the area of sunlight illumination by the system to the area of the photovoltaic panel used), and on the other hand, the height of the system can be reduced due to twice reflection, making the system according to the present disclosure can be employed extensively. And at the same time, the system can be better designed with flexibility in its structure, so that heat dissipation of a photovoltaic panel or heat energy utilization can be performed more easily.

Specific examples according to the present disclosure will be described in detail below with reference to accompanying drawings.

DETAILED DESCRIPTION

A Fresnel lens is employed in the convergence system of a light-converging solar energy system according to the present disclosure. For ease of understanding, related concepts will be firstly described below.

The Fresnel lens is a thin lens. It can be produced by means of dividing the continuous original surface of a conventional lens into several sections, reducing the thickness of each section, and placing all the thin sections on an identical plane or an identical substantially smooth curved surface. Such discontinuous refracting surfaces evolved from the original surface can be referred to as a Fresnel refractive surface which is generally stepped or toothed. Theoretically the Fresnel refractive surface may have approximate optical properties compared to the corresponding original surface, but its thickness is greatly reduced. The Fresnel refractive surface generated by a single original surface can be called a Fresnel unit.

The original surface commonly used for generating the Fresnel refractive surface is generally a symmetrical surface around an optical axis, such as a spherical surface, a rotating paraboloid and other rotating surfaces. The focus of a conventional original surface is at one point, so it can be called "concurrent plane". In the present disclosure, the original surface can be any type of coaxial surface, and can be specifically set according to actual needs. The so-called coaxial surface refers to curved surfaces having focus on an identical line (not necessarily at an identical point). This line can be called a "coaxial line". The conventional concurrent plane can be regarded as a special case when the coaxial line of the coaxial surface degenerates to a point. With an original surface that is coaxial but non-concurrent, a sensing element provided at a focus position can be expanded from a smaller area (corresponding to the focus) to a long strip (corresponding to the coaxial line made up of the focus), thus enhancing the ability to collect signal and helping to solve local overheating issues without significantly increasing costs. Typical coaxial surfaces include rotating surfaces (containing secondary or higher-order rotating surfaces), cylindrical surfaces, conical surfaces and so on. The cylindrical surfaces, which can also be referred to as uniform section coaxial surfaces, have the same cross sections after being cut at any point along the vertical direction of the coaxial line. A circular cylindrical surface is a special case of the cylindrical surface. The conical surfaces have cross sections with a similar shape but different sizes. A circular conical surface is a special case of the conical surface.

Figure 1:
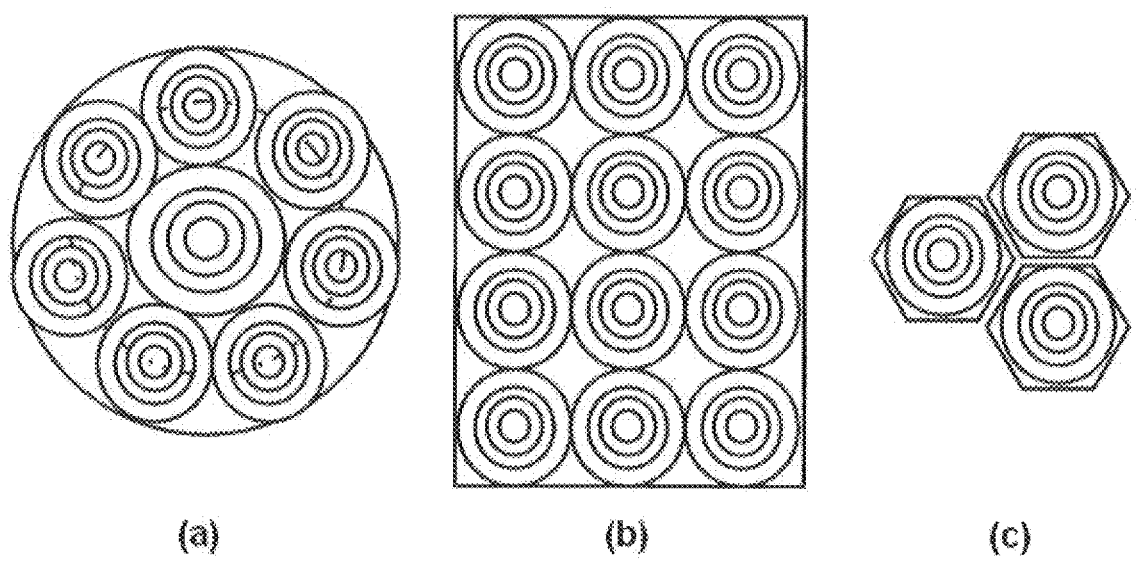
FIG. 1 is a schematic diagram of several arrangements of a composite Fresnel refracting surface in the present disclosure.

A "macro" refracting surface composed of one or more Fresnel units may be referred to as a tooth surface, and a substantially smooth or flat surface opposite thereto may be referred to as a reverse side. The tooth surface containing only one Fresnel unit can be referred to as a "single Fresnel refracting surface", and the tooth surface containing two or more Fresnel units can be referred to as a "composite Fresnel refracting surface". Generally, the basic parameters of each Fresnel unit on the composite Fresnel refracting surface (e.g. area, focal length, shape of the corresponding original surface, number of concentric rings used for dividing the original surface, etc.) can be arranged flexibly and can be identical, partially identical, or completely different. In an embodiment, each Fresnel unit on the composite Fresnel refracting surface has its own optical center, but the focus thereof falls on an identical point or line, or in a limited area. This can be achieved by spatially arranging all the Fresnel units that form the composite Fresnel refracting surface. FIG. 1 illustrates several typical arrangements of Fresnel units in a composite refracting surface, among which FIG. 1(a) shows a circularly symmetric arrangement, FIG. 1(b) shows a determinant arrangement, and FIG. 1(c) shows a honeycomb arrangement. It can be considered that these Fresnel units are arranged on a "macro" surface such as a plane, a quadratic surface (including a spherical surface, an ellipsoidal surface, a cylindrical surface, a parabolic cylinder, a hyperbolic cylinder), a high-order polynomial surface (which is a usual way to implement aspheric surface), and a folding or terraced surface formed by splicing a plurality of planes.

Generally speaking, various types of elements can be made by flexibly combining the tooth surface with the reverse side. For example, a Fresnel lens having a tooth surface and a reverse side may be referred to as a "single-sided Fresnel lens"; and further, if the tooth surface is a "simple Fresnel refracting surface", the lens may be a "single sided simple Fresnel lens", and if the tooth surface is a "composite Fresnel refracting surface", the lens may be a "single-sided composite Fresnel lens". A Fresnel lens having both sides of tooth surfaces can be called "double-sided Fresnel lens", and similarly, it can be further classified into "double-sided simple Fresnel lens"and "double-sided composite Fresnel lens". If one tooth surface of a double-sided Fresnel lens is a simple Fresnel refracting surface, and the other tooth surface thereof is a composite Fresnel refracting surface, the lens may be referred to as a "double-sided mixed Fresnel lens". In addition, as to a variation of the double-sided Fresnel lens, if one tooth surface thereof is a "simple Fresnel refracting surface", it may be replaced by a conventional convex lens surface or a conventional concave lens surface.

The two reflecting surfaces used in the convergence system of the present disclosure may be planar reflecting surfaces or curved reflecting surfaces, such as concave or convex reflecting surfaces, and may also be tooth surface shaped reflecting surfaces. The two reflecting surfaces are arranged to enable incident sunlight to converge on a first reflecting surface through a first Fresnel lens, and to be reflected at least partially by the first reflecting surface onto a second reflecting surface. Each reflecting surface may be provided by an element that has only a single reflective function, such as a plate with a reflective coating, where light can be reflected directly on the surface of the element. The reflecting surface may also be provided by a reflective lens. The so-called reflective lens refers to a lens with a reflective coating, where the light is refracted from a transmission surface into the lens, and then reflected by a reflecting surface, and again refracted out of the lens via the transmission surface.

Figure 2:
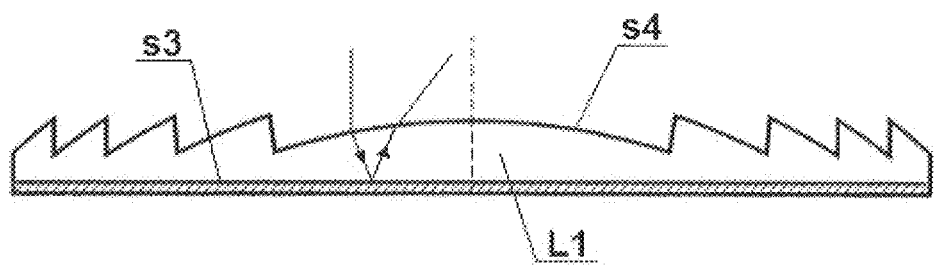
FIG. 2 is schematic diagram of a reflective Fresnel lens in the present disclosure.

As a preferred embodiment, the reflecting surface may be provided by a reflective Fresnel lens, which may be regarded as a combination of a Fresnel lens and a reflecting surface, with reference to FIG. 2. In FIG. 2, the element L1 has a reflecting surface s3 and a Fresnel refracting surface s4, and the light is refracted from the refracting surface into the lens and then reflected by the reflecting surface, and again refracted out of the element through the refracting surface. The incident light path passes twice through the physical refraction interface s4 due to reflection. The physical interface is in fact equivalent to two tooth surfaces, so that the convergence effect of the system can be advantageously enhanced by providing the reflecting surfaces. In some embodiments, the first Fresnel lens can be combined with the first reflecting surface, acting as a reflective Fresnel lens. In other embodiments, the convergence system may include two Fresnel lenses, and the second Fresnel lens combining with the first reflecting surface may act as a reflective Fresnel lens.

Several modes of use of the light-concentrating solar energy system according to the present disclosure will be described below by way of examples with specific scenarios.

First Embodiment

Figure 3:
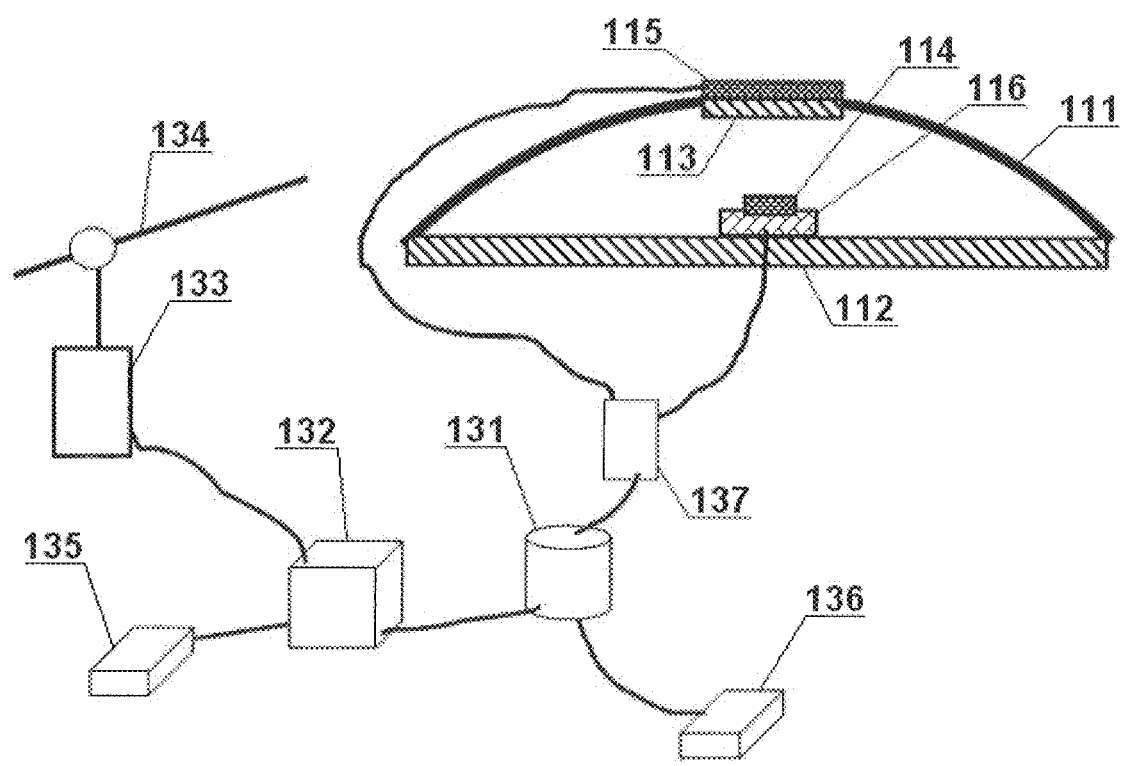
FIG. 3 is a schematic diagram of a light-concentrating solar energy system of a first embodiment.

Referring to FIG. 3, a light-concentrating solar energy system according to an embodiment of the present disclosure may include a first Fresnel lens 111, a first reflecting surface 112, a second reflecting surface 113 and a first photovoltaic panel 114.

The first Fresnel lens 111 provides an inward-facing tooth surface and a smooth outer surface, and the shape of the "macro" curved surface of the lens is a circularly symmetrical cambered surface. In this embodiment, the two reflecting surfaces and the first Fresnel lens have the same axis of rotational symmetry, i.e., optical axis. In other embodiments, the two reflecting surfaces and the first Fresnel lens may also have the same symmetrical split surface. The so-called symmetrical split surface refers to a plane that divides a geometric shape into two parts, and the two divided parts being symmetrical with respect to the plane. The advantage of having the same symmetrical split surface between the elements is that the space size can be fully utilized to achieve a compact layout. Furthermore, compared with the one having the same axis of rotational symmetry, the one having the same symmetrical split surface can greatly enrich the possible form of the convergence system. The design shown in FIG. 3 may not only be applicable to a light-concentrating solar energy system in which each element has the same axis of rotational symmetry, but also to a light-concentrating solar energy system in which each element has the same symmetrical split surface.

The first 112, which is located below the first Fresnel lens, may use a reflector or a plane mirror having a circular "macro" shape. In other embodiments, the first reflecting surface may also be acted by the bottom surface of a reflective Fresnel lens, so that there will be two Fresnel lenses in the system to be able to obtain a greater light-concentration ratio.

The second reflecting surface 113 is arranged at the centre of the first Fresnel lens 111. For example, a reflective film coated at the center (outside or inside) of the first Fresnel lens 111 may serve as the second reflecting surface.

The first photovoltaic panel 114 is arranged at the centre of the first reflecting surface 112. With the structure of this embodiment, a high light-concentration ratio can be obtained, making it easier to centrally cool or to intensively utilize the heat energy generated by the first photovoltaic panel.

In this embodiment, a second photovoltaic panel 115 and a thermal energy utilization device may also be provided to achieve higher energy utilization efficiency.

The second photovoltaic panel 115 is arranged over the second reflecting surface, so that the sunlight blocked by the second reflecting surface can also be absorbed and utilized to enhance the efficiency of one-time utilization of light energy.

The thermal energy utilization device 116 is arranged below the first photovoltaic panel, and at least one heat conducting end thereof is thermally connected with the first photovoltaic panel. The thermal energy utilization device referred in the present disclosure may be various thermal energy convention devices or thermal energy conduction and storage devices, such as a device using temperature difference for power generation, a water heater and the like, and may be connected with the photovoltaic panel in a thermal conduction manner which may be determined according to the type of the device. By further utilizing relatively concentrated thermal energy generated by the first photovoltaic panel with the thermal energy utilization device, the solar energy that has not been used to perform photoelectric conversion can be utilized again; thus not only reducing the temperature of the photovoltaic panel, but also effectively improving the overall utilization efficiency of solar energy. In this embodiment, the thermal energy utilization device is a device using temperature difference for power generation, and the heat conducting end thereof for heat inflow clings to the first photovoltaic panel so as to perform heat dissipation by utilizing the huge area of the reflecting surface. In other embodiments, better heat dissipation can be further achieved by employing external cooling, for example, placing the entire device on an external cold source.

As a preferred embodiment, the edge of the first reflecting surface and the edge of the first Fresnel lens are connected to each other to form a relative closed space, thus preventing the entry of dirt and the like from outside, ensuring efficient work of the photovoltaic panels and extending their useful life. Further, the second photovoltaic panel may also be arranged inside the first Fresnel lens, making it easier to clean and manage the surface of the system.

As a preferred embodiment, at least one reflecting surface may be made of a conductive material (e.g. metal) with coating film, and be connected to circuitry in the system. In this way, under special situation, such as when it is snowing or freezing in winter, the system may be heated by powering on the reflecting surface to melt snow or remove ice, thus ensuring the system can be used normally under extreme weather conditions.

In order to better store and utilize electric energy obtained by converting solar energy, this embodiment may also include the following listed additional elements. In other embodiments, one or several of them may only be selectively provided according to actual requirements.

An energy-storing device 131, which is electrically connected to the photovoltaic panel, is configured for storing electric energy. The energy storage can be selected from a group consisting of super-capacitors, rechargeable batteries, and air compressors.

An AC inverter 132, which is electrically connected to the energy-storing device (it may also be directly connected to the photovoltaic panel in other embodiments), is configured for connecting its power output to a grid switch cabinet 133. The grid switch cabinet is coupled to an external AC power grid 134 so that the electric energy generated by the solar energy system can be incorporated into the external power grid. The AC inverter may also be externally connected to an AC wiring board 135 so as to directly provide the AC output to users.

A DC voltage output device 136, which is electrically connected with the energy-storing device (it may also be directly connected with a double-sided photovoltaic panel in other embodiment), is configured for outputting a DC voltage for use by users. The DC voltage outputted by the output device may include, for example, 12V, 9V, 5V, 3V, 1.5V, etc.

A status indicating and controlling device 137 is configured for detecting and displaying operating parameters of the system, and controlling the operating status of the system. These operating parameters may be voltage, current, power, temperature, etc., so that users can grasp the operating status of each photovoltaic panel, the overall state of the system, etc.. These parameters can be obtained by providing detecting devices corresponding to the type of the required parameters, such as a temperature probe. The system can be controlled manually or automatically. For example, the reflecting surface made of a metal coating can be controlled to be powered on to heat based on a detected temperature of the photovoltaic panel to achieve automatic de-icing.

Second Embodiment

Figure 4:
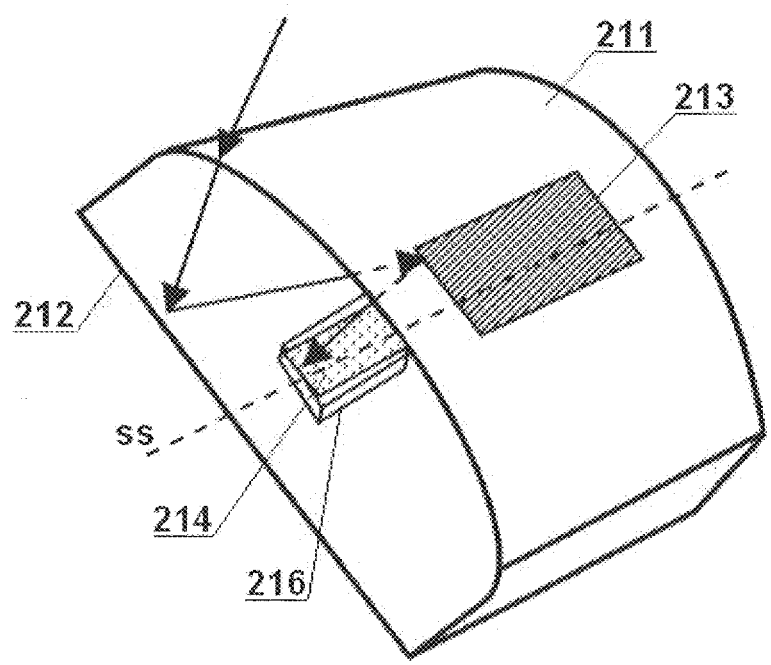
FIG. 4 is a schematic diagram of a light-concentrating solar energy system of a second embodiment.

Referring to FIG. 4, a light-concentrating solar energy system according to another embodiment of the present disclosure may include a first Fresnel lens 211, a first reflecting surface 212, a second reflecting surface 213 and a first photovoltaic panel 214.

The shape of the "macro" curved surface of the Fresnel lens 211 is a coaxial surface, and the two reflecting surface and the first Fresnel lens have the same symmetrical split surface.

The first reflecting surface 212 is arranged below the first Fresnel lens. Since the projection of the first Fresnel lens on the first reflecting surface is a square, the outer shape of the first reflecting surface is preferably a square. The first reflecting surface may be a plane, or a condensing and reflecting surface which is of axial symmetry or circular symmetry; and the last one is used in this embodiment.

The second reflecting surface 213 is arranged at the top of the first Fresnel lens 111. Since the focus position of the first Fresnel lens is not a point but a line, the external shape of the second reflecting surface is a rectangular shape extending along the extending direction of the coaxial line ss of the first Fresnel lens. As the first reflecting surface adopts a condensing and reflecting surface which is of circular symmetry, the length of the second reflecting surface may be smaller than that of the coaxial line of the first Fresnel lens.

The first photovoltaic panel 214 is arranged at the center of the first reflecting surface 212 and has an elongated strip shape. In the present embodiment, the second reflecting surface may also adopt a condensing and reflecting surface which is of circular symmetry (e.g. a concave reflecting mirror), so the length of the first photovoltaic panel is further reduced as compared with the length of the second reflecting surface, making the system has a relatively large light-concentration ratio. The arrows shown in FIG. 4 indicate the light path of the incident sunlight.

This embodiment shows a case where the surfaces which is of circular symmetry (i.e. the two reflecting surfaces) is used together with the coaxial surface (i.e. the Fresnel lens), taking into consideration the limitation of the external shape and the need to increase the light-concentration ratio.

Similar to the first embodiment, a thermal energy utilization device 216 is also used in this embodiment to increase solar energy utilization. Specifically, it may be a water tank located below the first photovoltaic panel and is in communication with the water supply system. Moreover, a second photovoltaic panel (not shown) may be further provided above the second reflecting surface 213. For example, a reflective film may be coated on the inner surface of the top of the first Fresnel lens, and a photovoltaic film may be pasted on the outer surface of the top of the lens.

In this embodiment, the solar energy system may be designed to be a square in shape and can be repeatedly arranged and spliced along the direction of the coaxial line or the direction perpendicular to the coaxial line. In other embodiments, the shape may also be a triangle, a hexagon and the like. Each solar energy system used for splicing can be regarded as a module; and each module is provided around it with a conductive interface (not shown) for connecting to each other, such as a plug-in or contact-making interface. In this way, when several modules are spliced together, they can form a solar energy system that can cover a large area and have a uniform external interface. Such modular mariner is very beneficial for large-scale solar energy system. On the one hand, the size of a single module can be designed to be small for ease of manufacture, transportation and installation; on the other hand, the modules may share identical external interfaces and external devices such as inverters and storing devices after forming into a single unit by simple splicing, thus avoiding waste. In other embodiments, the appearance of the module may also be designed to be other kind that can be repeatedly arranged and spliced according to set rules, or may also be determined according to actual needs.

The solar energy system of this embodiment can be used to be installed on the roof of a building, either directly as a roof of a new construction or on an old roof of an existing building. The first Fresnel lens can be made of a rigid and transparent material, such as hard plastic, resin, glass and the like. The modular splicing method thereof makes it possible to be suitable for roofs of various shapes. With the system, the light-concentration ratio can be high, the cost may be reduced. Moreover, since the photovoltaic panels can be easily enclosed within the cavity and the outer surface is relatively smooth, it is possible to clean with ease and extend the overall useful life of the system.

Third Embodiment

Figure 5:
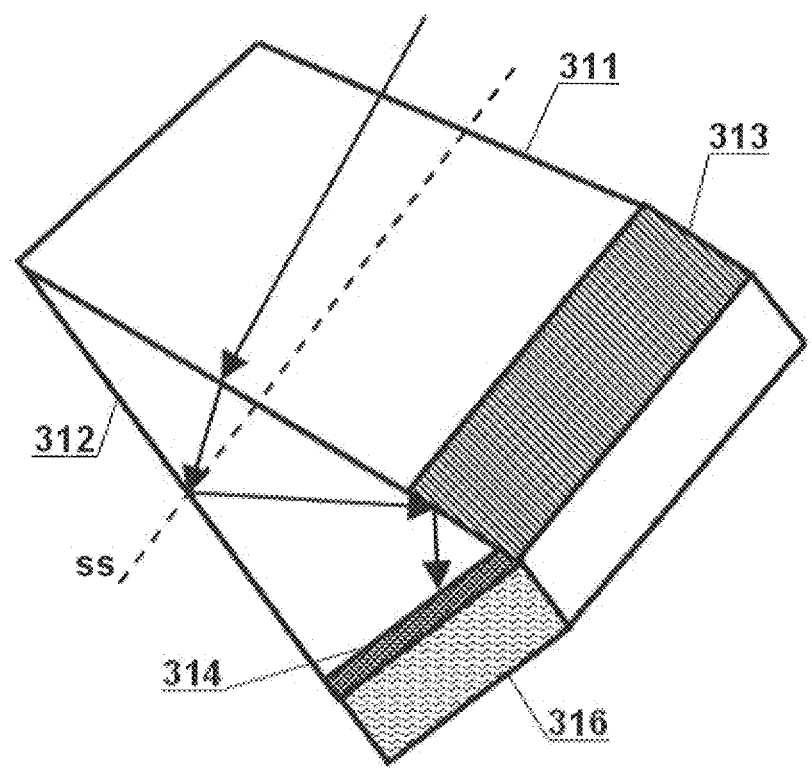
FIG. 5 is a schematic diagram of a light-concentrating solar energy system of a third embodiment.

Referring to FIG. 5, a light-concentrating solar energy system according to yet another embodiment of the present disclosure may include a first Fresnel lens 311, a first reflecting surface 312, a second reflecting surface 313 and a first photovoltaic panel 314.

The shape of the "macro" curved surface of the first Fresnel lens 311 is planar, and the original curved surface of the tooth surface of the lens is a coaxial surface; accordingly, the incident sunlight may be converged into a strip shape, and the corresponding two reflecting surfaces and the photovoltaic panel are rectangular.

The first reflecting surface 312 is planar and forms an angle with the first Fresnel lens.

The second reflecting surface 313 is planar and is arranged at the side of the first Fresnel lens facing away from the first reflecting surface (it can be realized by plating a reflective film on the corresponding position of the first Fresnel lens).

The first photovoltaic panel 314, together with the first Fresnel lens and the two reflecting surfaces, encloses an approximately triangular cavity. The arrows shown in FIG. 5 indicate the light path of the incident sunlight.

Similar to the first embodiment, a water tank 316 is also provided below the first photovoltaic panel to improve solar energy utilization in this embodiment.

The solar energy system in this embodiment may also be expanded in a modular splicing manner; for example, it can be spliced in the direction of the coaxial line ss or the direction perpendicular to the coaxial line. Therefore, the solar energy system in this embodiment may also be suitable for installation on the roof of a building, or other places where large area may be needed for paving. It is noted that the overall structure of the system in the embodiment has an irregular shape, which means that the convergence system with the two reflecting surfaces disclosed herein can have a rich and flexible structural form.

Fourth Embodiment

Figure 6:
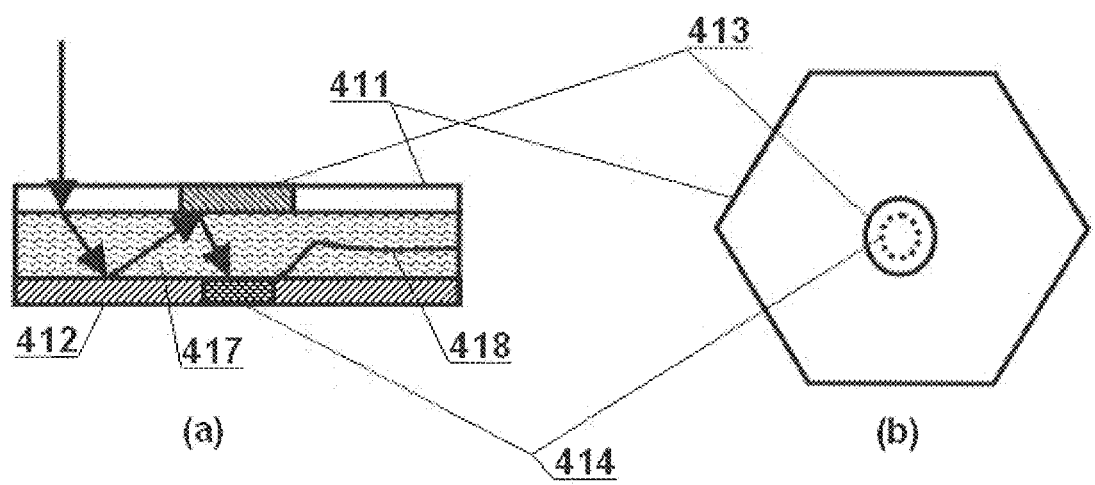
FIG. 6 is a schematic diagram of a light-concentrating solar energy system of a fourth embodiment.

A light-concentrating solar energy system according to still yet another embodiment of the present disclosure is illustrated in FIG. 6, where (a) is a cross-sectional view and (b) is a top view. The system of this embodiment includes a first Fresnel lens 411, a first reflecting surface 412, a second reflecting surface 413 and a first photovoltaic panel 414.

The shape of the "macro" curved surface of the first Fresnel lens 411 is planar, and the original curved surface of the tooth surface of the lens is a concurrent plane; accordingly, the incident sunlight may be converged to the centre.

The first reflecting surface 412 is arranged below the first Fresnel lens, and its shape is the same as that of the first Fresnel lens, and the edge of the two are connected to form a closed cavity. The cavity can be vacuumed. However, the cavity may be filled with a transparent and insulating cooling liquid or compressed gas 417 for enhancing the bearing capacity of the whole structure and also for helping the heat dissipation of the photovoltaic panel.

The second reflecting surface 413 is arranged at the center region of the first Fresnel lens (which can be implemented by coating, or pasting a reflective paper on the inner surface).

The first photovoltaic panel 414 is arranged at the center of the first reflecting surface, and is connected to the outside of the closed cavity via a wire 418. The arrows shown in FIG. 6 indicate the light path of the incident sunlight.

The solar energy system in this embodiment may also be expanded in a modular splicing manner; for example, referring to FIG. 6, the appearance of the module is designed as a regular hexagon, which can facilitate large-area pavement. The modular structure of this embodiment can be mainly made of tempered glass or plastic material. Due to employing the structure having the two reflecting surfaces, the overall thickness of the system can be greatly reduced, and it is suitable for installation on the ground, for example, it can replace ordinary road bricks and can be used to pave sidewalks, floor tops, squares, etc. to achieve safe and reliable pavement power generation. In order to improve safety, especially when used in a place where it freezes more easily in winter, the outer surface of the first Fresnel lens may be provided with a non-skid structure including, but not limited to, small bumps provided on the surface, anti-skid figures, and anti-skid materials such as rubber placed slightly above the surface of the module at the joints of the spliced modules.

Fifth Embodiment

Figure 7:
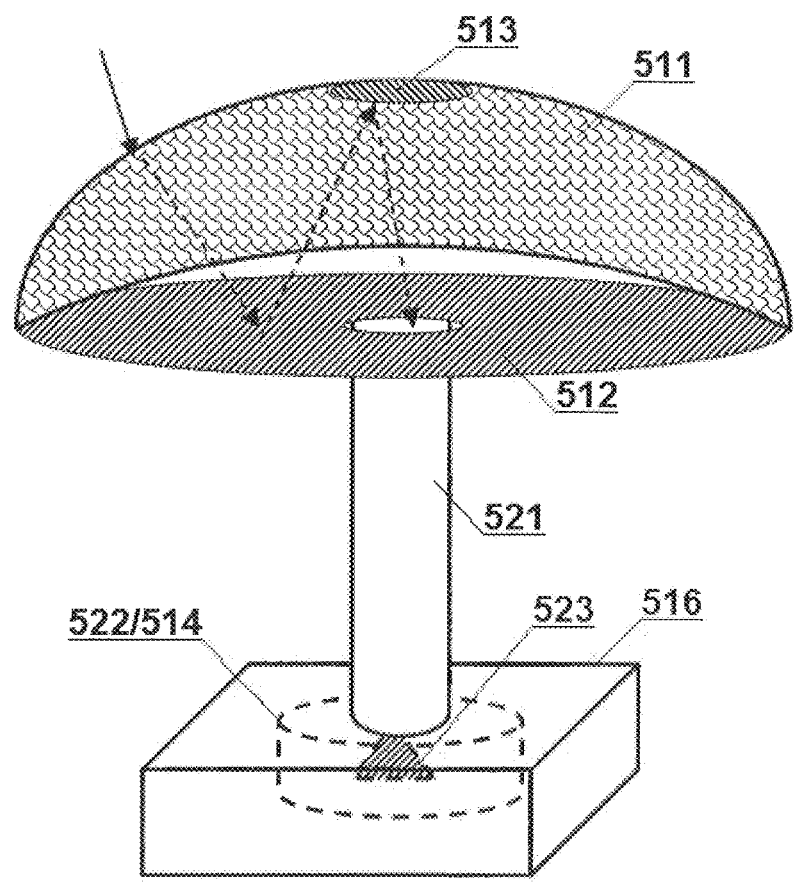
FIG. 7 is a schematic diagram of a light-concentrating solar energy system of a fifth embodiment.

Referring to FIG. 7, a light-concentrating solar energy system according to a still yet another embodiment of the present disclosure may include a first Fresnel lens 511, a first reflecting surface 512, a second reflecting surface 513, a first photovoltaic panel 514, a light-guiding device 521 and a relatively closed solar energy receiving chamber 522.

The structure for condensing the sunlight in this embodiment is similar to that of the first embodiment; the difference therebetween is that, the sunlight reflected by the second reflecting surface directly irradiates to the first photovoltaic panel in the first embodiment, while in this embodiment the sunlight reflected by the second reflecting surface is further guided into the relatively closed solar energy receiving chamber for more fully utilizing the collected sunlight. The arrows shown in FIG. 7 illustrate the light path of the incident sunlight.

The first Fresnel lens and the two reflecting surfaces have a structure of circular symmetry in this embodiment. The first reflecting surface is arranged below the first Fresnel lens, and the second reflecting surface is arranged at the center of the first Fresnel lens.

The entrance of the light-guiding device 521 is located at the center of the first reflecting surface, so that the sunlight reflected by the second reflecting surface enters the light-guiding device, and then be guided into the solar energy receiving chamber via the light-guiding device. The light-guiding device can be made according to various existing light transmission technologies. For example, it can be made of a solid transparent material or a hollow pipe, and its outer surface or inner surface is coated with a reflective film, so that the sunlight can only go ahead and irradiate into the receiving chamber after entered the light-guiding device. In addition, the light-guiding device may also serve as a support for the concentrating structure located above to form a structure such as a solar umbrella, a solar tent or a solar street lamp that can be installed on the ground.

The inner wall of the solar energy receiving chamber 522 is laid as a photovoltaic panel or a reflector. It can be considered that the first photovoltaic panel 514 is arranged inside the solar energy receiving chamber or on the inner wall thereof. The solar energy receiving chamber is "relatively closed", which means that the sunlight incident into the chamber may not be free to dissipate. Since the inner wall of the receiving chamber is full of photovoltaic panels or reflectors, the sunlight may be eventually converted into electric energy or thermal energy once it enters the chamber. As a preferred embodiment, in order to avoid the dissipation of sunlight, a tapered reflector 523 may be disposed on the light-guiding device at the entrance of the receiving chamber, so that the light is scattered as soon as it enters the light-guiding device and is hard to leave the receiving chamber through the light-guiding device.

For better use of thermal energy generated by the sunlight, a thermal energy utilization device 516 is also provided in this embodiment; and the solar energy receiving chamber is entirely enclosed in the thermal energy utilization device. The thermal energy utilization device, such as a cooling tank or a hot water tank, may be made of a transparent or opaque material.

The solar energy system in this embodiment may not only have a high light-concentration ratio (e.g. greater than 100:1), but also increase the efficiency of energy conversion and utilization because the collected sunlight is fully utilized in the closed chamber and avoid light pollution and high temperature.

The principle and implementation manners present disclosure has been described above with reference to specific embodiments, which are merely provided for the purpose of understanding the present disclosure and are not intended to limit the present disclosure. It will be possible for those skilled in the art to make variations based on the principle of the present disclosure.

The invention claimed is:

1. A light-concentrating solar energy system, comprising:
   a first Fresnel lens provided with at least one tooth surface;
   a reflective Fresnel lens comprising a second Fresnel lens and a first reflecting surface, the second Fresnel lens provided with one tooth surface and one flat back surface, wherein the first reflecting surface is provided at the flat back surface of the second Fresnel lens;
   a second reflecting surface; and
   a first photovoltaic panel;
   wherein
   the first Fresnel lens, the reflective Fresnel lens and the second reflecting surface have the same axis of rotational symmetry,
   the reflective Fresnel lens is located below the first Fresnel lens,
   the second reflecting surface is arranged at the center of the first Fresnel lens, so that the incident sunlight converged via the first Fresnel lens and then further converged and reflected via the reflective Fresnel lens can at least partially irradiate to the second reflecting surface,
   the first photovoltaic panel is arranged at the center of the reflective Fresnel lens, so that at least part of the sunlight reflected by the second reflecting surface can irradiate to the first photovoltaic panel.

2. The solar energy system of claim 1, having one or more of the following characteristics:
   the edge of the first reflecting surface and the edge of the first Fresnel lens being connected to each other to form a relatively closed space;
   a second photovoltaic panel further comprised and arranged over the second reflecting surface; and
   a thermal energy utilization device further comprised and arranged below the first photovoltaic panel, at least one heat conducting end of the thermal energy utilization device being thermally connected with the first photovoltaic panel; and the type of the thermal energy utilization device being selected from a group consisting of: thermoelectric conversion device, and water heater.

3. The solar energy system of claim 1, having one or more of the following characteristics:
the shapes of a macro curved surface of the first Fresnel lens and the first reflecting surface being planar, both the edge thereof being connected to form a closed cavity which is vacuumed or filled with an insulating liquid or compressed gas; and
the outer surface of the first Fresnel lens being provided with a non-skid structure.

4. The solar energy system of claim 1,
further comprising a light-guiding device and a solar energy receiving chamber, wherein
the sunlight reflected by the second reflecting surface at least partially enters the light-guiding device, and the light-guiding device guides the sunlight into the solar energy receiving chamber; and
the first photovoltaic panel is arranged in the solar energy receiving chamber, and the inner wall of the solar energy receiving chamber is laid as a photovoltaic panel or a reflector.

5. The solar energy system of claim 1, having one or more of the following characteristics:
the shape of a macro curved surface of the first Fresnel lens being a surface of circular symmetry or a coaxial surface;
one side of the first Fresnel lens being a tooth surface and another side thereof being a tooth surface having an identical or different type, a plane, a concave surface or a convex surface;
the type of the first or the second reflecting surface being selected from a group consisting of a plane, a concave surface, a convex surface and a tooth surface; and
the type of a reflective element providing the first or the second reflecting surface being selected from a group consisting of an element having only a single reflective function, and a reflective lens.

6. The solar energy system of claim 1, wherein
multiple solar energy systems are able to be repeatedly arranged and spliced according to a set rule, each solar energy system used for splicing can be regarded as a module; and each module is provided around itself with a conductive interface for connecting to each other.

7. The solar energy system of claim 1, wherein
at least one reflecting surface of the first and the second reflecting surfaces is made of a conductive material with coating film and is connected to a control circuit in the system so as to heat the at least one reflecting surface when it is powered.

8. The solar energy system of claim 1, further comprising one or more of the following elements:
an energy-storing device electrically connected to the first photovoltaic panel and configured for storing electric energy, wherein the energy-storing device is selected from a group consisting of super-capacitors, rechargeable batteries, and air compressors;
a DC voltage output device electrically connected with the energy-storing device and configured for outputting a DC voltage; and
a status indicating and controlling device configured for detecting and displaying operating parameters of the system, and controlling the operating status of the system, wherein the operating parameters are selected from a group consisting of voltage, current, power and temperature.

\* \* \* \* \*